United States Patent [19]

Williams

[11] Patent Number: 5,767,661

[45] Date of Patent: Jun. 16, 1998

[54] BATTERY CHARGER

[76] Inventor: Carlos Williams, 2851 McGaw Ave., Irvine, Calif. 92714

[21] Appl. No.: 822,494

[22] Filed: Mar. 21, 1997

[51] Int. Cl.[6] .............. H02J 7/00; G01N 27/416
[52] U.S. Cl. .............. 320/152; 320/DIG. 10; 324/429; 330/636
[58] Field of Search .............. 320/48, 36, 32, 320/30, 40, 150, 152, DIG. 10, DIG. 11, DIG. 12, DIG. 13; 324/429, 431, 433; 429/61, 90; 340/636

[56] References Cited

U.S. PATENT DOCUMENTS

| | | | |
|---|---|---|---|
| 4,423,379 | 12/1983 | Jacobs et al. | 324/429 |
| 4,740,739 | 4/1988 | Quammen et al. | 320/14 |
| 4,843,299 | 6/1989 | Hutchings | 320/31 |
| 5,367,244 | 11/1994 | Rose et al. | 320/23 |
| 5,426,371 | 6/1995 | Salley et al. | 324/429 |
| 5,633,576 | 5/1997 | Rose et al. | 320/23 |

*Primary Examiner*—Adolf Berhane
*Assistant Examiner*—Gregory J. Teatley, Jr.
*Attorney, Agent, or Firm*—Georges A. Maxwell

[57] ABSTRACT

An emergency stop warning system for an automobile with a hydraulically operated brake system and that includes an electric power supply, a warning sound emitting electrically operated horn connected with the power supply, a normally open fluid pressure actuated switch electrically connected between the power supply and the horn and hydraulically connected with the brake system; that the hydraulically actuated switch is set to close and cause the horn to sound when fluid pressure in the braking system is increased to cause the automobile to decelerate and stop at a faster than normal rate.

18 Claims, 3 Drawing Sheets

BATTERY CHARGER

BACKGROUND OF THE INVENTION

Throughout the art of motorized equipment and devices, such as automobiles, lead-acid storage batteries are provided and utilized as auxiliary sources of electric power.

Throughout today's automotive industry, 12-volt batteries that store from 30 to 100 or more ampere hours of power are the most common and widely used lead acid storage batteries. The charger of the present invention is intended and is particularly suited for testing and charging 12-volt storage batteries that are provided for automobiles and the like.

Automobiles are equipped with internal combustion engines. The engines are equipped with electric power starter motors and electric powered ignition systems; and electric power generating alternators (or generators) that generate and supply the electric power that is required to sustain operation of the engines when the engines are operating.

The primary purpose to which batteries are put, in automobiles, is to supply electric power to electric starter motors and to electric ignition systems when starting the engines. Secondary purposes to which batteries are put are to supply electric power to electric lamps, radios and other electric powered accessories when the engines are not operating and when the engines are operating but the alternators do not generate sufficient power to meet the demands for power.

During the normal operation of automobile engines, the alternators thereof are intended to and normally generate sufficient electric power for delivery of current to the batteries to replace power that has been discharged therefrom and to keep the batteries substantially fully charged.

In practice, when batteries are about 50% discharged they are so depleted of power that they cannot deliver sufficient power (cranking power) to the starter motors of their related engines to start the engines.

It is to be particularly noted that when a battery is discharged to the extent that it has insufficient cranking power to start its related engine it is not necessarily "dead" or in any way defective. Most often, when the foregoing occurs, the battery is in good condition and only needs to be recharged.

Due to present day battery merchandising practices and battery servicing practices a large number of good batteries that only need to be recharged are treated as "dead and/or defective" and are disposed of accordingly.

Throughout the art, battery retailers seek to establish and maintain the goodwill of their customers and their reputation within the marketplace by being agreeable to their customers demands, and, to afford their customers fast, efficient and dependable service.

The manufacturers of batteries, in order to gain and maintain desired shares of the marketplace, have given warranties that provide for the replacement of batteries that are reasonably determined to be defective or incapable of serving their intended purpose. Many of those warranties provide for discounts on the purchase price of new replacement batteries. Most of those warranties prorate the discounts for scheduled periods of time following the purchased date of the batteries to be replaced.

As a result of the foregoing, when a good battery that has become discharged to the extent that it will not effect starting of its related engine and the purchaser/owner of that battery takes the battery to the retailer from whom he purchased the battery and suggests that the battery is defective or ineffective to serve its intended purpose, many retailers are inclined to simply replace the battery with a new replacement battery with a "no questions asked" attitude. This handling and/or treatment of batteries by the retailers saves them valuable time and avoids haggling and customer dissatisfaction.

In most instances, a manufacturer's warranty requires that a battery be subjected to appropriate testing and/or that a reasonable effort be made to recharge it, before it can be replaced under warranty.

An important factor that affects the practicality of requiring retailers to test and charge batteries before replacing them under a manufacturer's warranty resides in the fact that the battery manufacturers cannot reasonably require their retailers to expend so much time testing and charging their batteries that the retailers are unreasonably burdened and the customers are subjected to long delays. In those instances where manufacturers' warranties require that their retailers extensively and/or carefully test and seek to recharge batteries before replacing them, many retailers tend to conduct quick and inadequate or superficial testing and charging procedures.

As a result of the foregoing the number and rate at which good rechargeable batteries are being treated as dead, defective and/or non-rechargeable batteries and are being replaced with new batteries, under manufacturers' warranties, is increasing at a notable rate and imposing serious adverse economic effects on battery manufacturers and retailers.

OBJECTS AND FEATURES OF THE INVENTION

It is an object of my invention to provide a new and improved lead-acid storage battery charger that first functions to test the battery with which it is connected to determine if that battery is a good and rechargeable battery and, that thereafter functions to conduct a recharging current to the battery to affect recharging thereof.

It is another object of the invention to provide a charger of the general character referred to above that is such that when it is connected with a dead, non-rechargeable battery and is put into operation, it immediately detects that the battery is dead and/or non-rechargeable and simultaneously signals the operator of the charger to discontinue further work upon the battery.

Yet another object of the present invention is to provide a charger of the general character referred to above that, upon being put into operation, immediately detects if the charger is improperly connected with the battery (reverse polarity) and functions to stop operation of the charger and to signal the operator of the charger to properly connect the charger with the battery, before any adverse effects are caused by the improper connection and before any appreciable time is wasted.

Still anther object of the present invention is to provide a charger of the general character referred to above that continuously monitors the temperature of the battery and functions to stop operation of the charger and to signal the operator thereof when the temperature of the battery exceeds a predetermined safe operating temperature.

It is an object and a feature of the present invention to provide a charger of the general character referred to above which, upon terminating charging of the battery automatically functions to subject the battery to a discharge load for a sufficient period of time to remove undesirable polarization within the battery.

Another object and feature of the present invention is to provide a charger of the general character referred to above wherein the chargeability of the battery and the amperage of the charging current that can be safely applied to it is determined by the measurement and comparison of certain voltages at the battery that are obtained during initial dynamic testing of the battery.

Finally, it is an object and a feature of the present invention to provide a charger of the general character referred to above that functions to determine and to signal the operator of the charger that the battery related thereto is dead or otherwise unchargeable in less than one minute after putting the charger into operation; that functions to detect defects in the battery that render it unsuitable for recharging and to signal the operator that the battery is un-chargeable in less than six minutes after putting the charger into operation; and, that functions to automatically subject a rechargeable battery connected therewith to a charging current of most appropriate value for a sufficient period of time to effect recharging thereof.

The above objects and features of my invention will be fully understood from the following detailed description of one preferred form and embodiment of the invention throughout which description reference is made to the accompanying drawings.

DETAILED DESCRIPTION OF THE INVENTION

Figure 1:
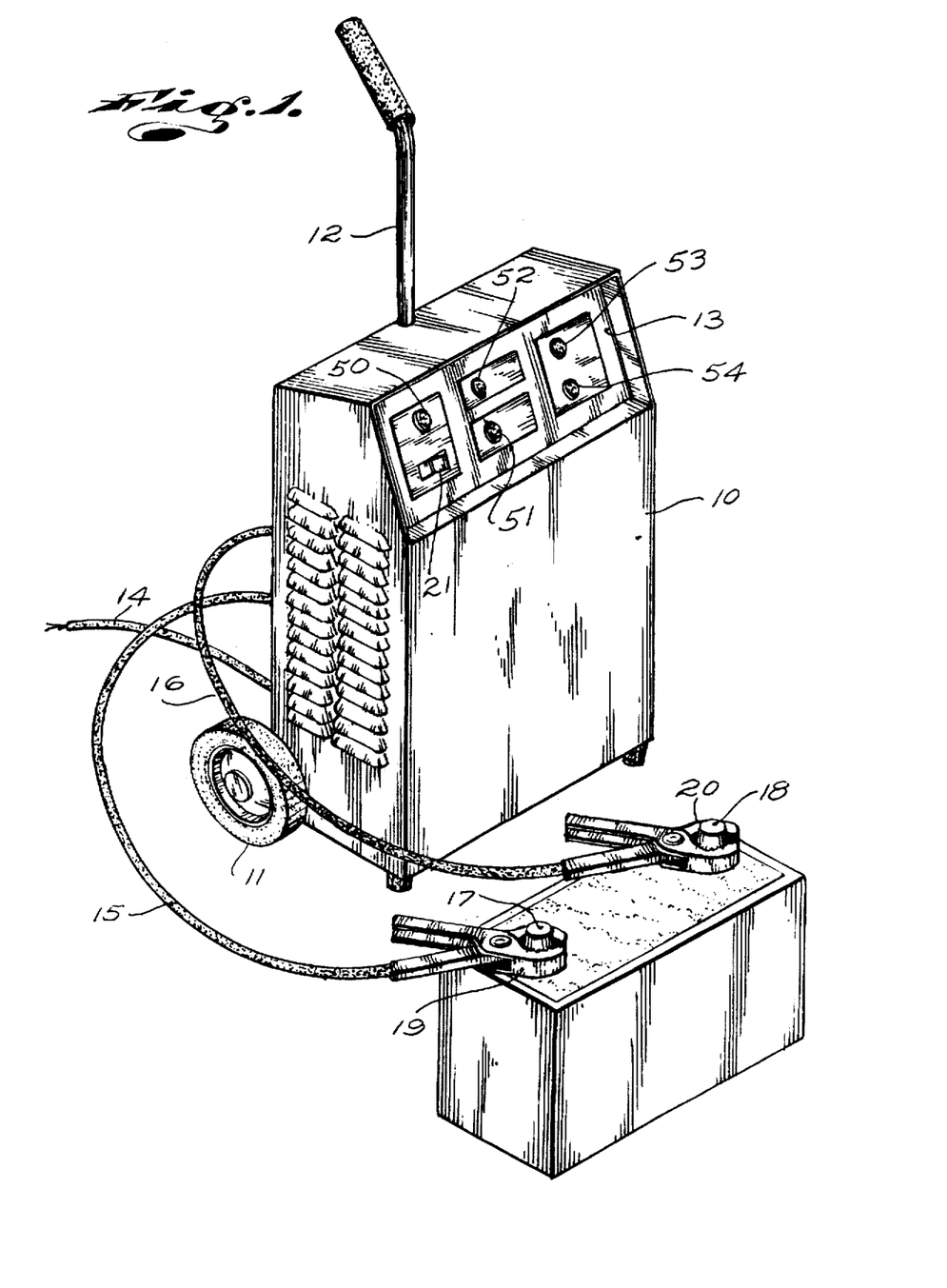
FIG. 1 is an isometric elevational view showing the top, front and one side of the battery charger embodying the invention and showing the charger connected with a battery.

The charger A of the present invention, as shown in FIG. 1 of the drawings is similar in appearance to those battery chargers that have been provided by the prior art for many years. As shown, the charger is characterized by a box-like case 10 with support wheels 11, a handle 12 and a control panel 13. Extending from the case is an elongate flexible power supply cord 14 that is releasably engagable with a common AC power supply outlet (not shown). The charger A next includes a pair of elongate charging current conducting cables 15 and 16 that extend from the case. The cables 15 and 16 are shown connected with the anode and cathode terminal posts 17 and 18 of a typical lead-acid storage battery B that is to be worked upon. The cables 15 and 16 are releasably connected with their related terminals 18 and 19 by spring loaded jaw clamps 19 and 20 that can be of any suitable construction and design.

The walls of the case 10 are provided with air conducting (louvered) openings to facilitate the movement of coolant air into and out of the case, in accordance with common practices.

Those electrical components and parts that are not shown in FIG. 1 of the drawings are suitably arranged and supported within the case 10. Since those electrical components and parts are, for the most part, commercially available components and parts, each of which, depending upon its source, can vary widely in size, shape and construction to an extent that it will require different space and different supporting structure than comparable parts from different sources, little or nothing might be gained by illustrating and describing an assembly of selected parts. Accordingly, the electric circuitry of the charger A will be illustrated in diagrammatic form only.

Figure 2:
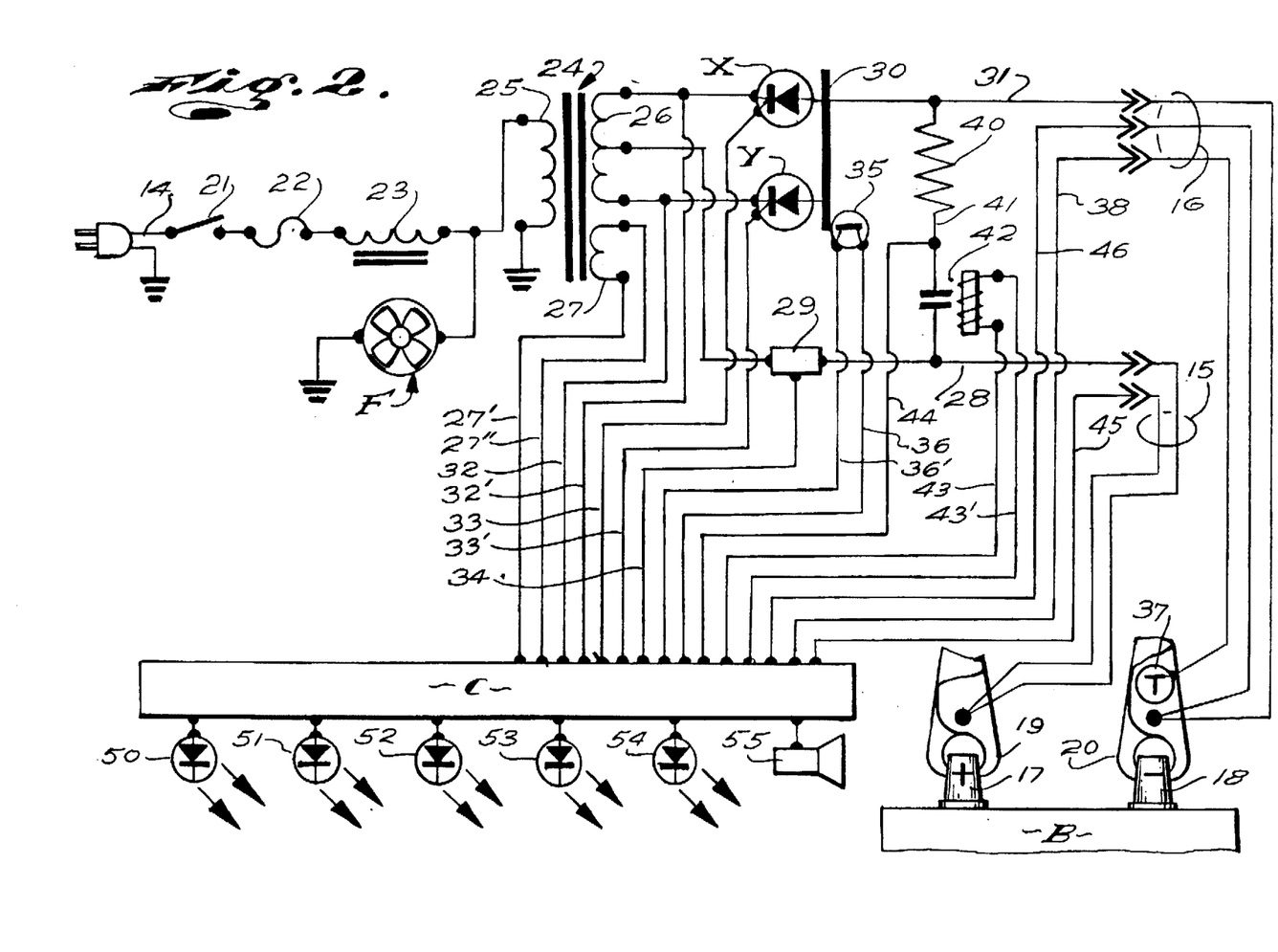
FIG. 2 is a circuit diagram of the charger.

Referring to FIG. 2 of the drawings, the electric circuitry of the charger A includes a manually operable on and off switch 21 that is connected with the power cord 14. The switch 21 is carried by and is accessible at the control panel 13.

The electric circuitry next includes a circuit breaker 22, connected with the switch 21, and a choke 23 connected with the circuit breaker 22, in accordance with common practices.

The electric circuitry next includes a step down transformer 24 that is connected with the choke 23. The power supplied to the charger is 110 volts or 220 volts AC and the transformer operates to lower the voltage of the alternating current to 12 volts.

As shown, the transformer has a primary winding 25 with which the choke is connected, and major and minor or first and second secondary windings 26 and 27.

Connected with the major secondary winding 26 of the transformer 24 is a DC charging current conducting first current line 28. The line 28 extends to and is suitably connected with the positive cable 15 that extends from the charger and that is connected with the anode terminal 17 of the battery B by means of the clamp 19.

A current voltage measuring shunt 29 is engaged in the line 28.

The electric circuitry of the charger A next includes a full wave rectifier 30 that is suitably connected with the major secondary winding 26 of the transformer 24. The rectifier 30 is that form of rectifier that includes a pair of Silicon Controlled Rectifiers (SCR) X and Y. The rectifier 30 is connected with the negative cable 16 that extends to and connects with the cathode terminal 18 of the battery B by a second DC charging current conducting current line 31. The rectifier 30 is put into and out of operation by operating voltages directed to the gates of the SCR's X and Y. The amperage of the DC charging current can be varied by controlling the operating voltages to the SCR's.

In accordance with old practices, an air moving fan F is connected with the AC power supply to the transformer 24 and operates to move cooling air into and out of the case 10 and about the electrical components and parts therein.

The electric circuitry thus far described is a basic circuitry that characterizes many battery chargers of the class here concerned with.

The battery charger A of the present invention next includes an electronic, computerized controller C of suitable design and construction. The controller C can vary widely in design and construction. Its design and construction depends upon its designer's choice of components and the design privileges the designer might elect to exercise. The controller includes an analog to digital converter, a circuit board that carries a programmable microprocessor, a memory section or memory bank and related electrical components and circuitry (not shown). The controller C is programmed and operates to sequentially read and store in memory data obtained from the battery B and from the electrical circuit of the charger, and, to compare and analyze that data in accordance with an installed two-phase program. The first phase of the program is a test phase that determines the condition of the battery and/or its ability to be recharged; and, the second is a charge phase that initiates and manages charging of the battery.

The controller C receives operating power from the minor secondary winding 27 of the transformer 24 through lines 27' and 27".

The controller C is connected with the opposite ends of the major secondary winding 26 of the transformer 24 and/or with the cathodes of the SCR's X and Y of the rectifier 30 by lines 32 and 32'.

The controller C is next connected with the gates of the SCR's X and Y of the rectifier 30 by lines 33 and 33'.

The controller C is next connected with the current voltage measuring shunt 29 in line 28 by a line 34. The shunt 28 serves to, in effect, read the current in line 28 and direct that reading to the controller C where it is stored in memory.

The pairs of lines 32—32' and 33—33' and line 34 noted above conduct those reference and control voltages between the controller C and the SCR's of the rectifier 30 and the shunt that enables the controller to control functioning of the rectifier 30.

In the preferred carrying out of the invention, a temperature sensor 35 (such as a thermostat) is in heat conducting relationship with the rectifier 30 and is connected with the controller C by lines 36 and 36'. In the event that the rectifier 30 becomes overheated, the controller C operates to turn off the rectifier and shut down or stop operation of the charger A until the temperature of the rectifier 30 lowers or returns to a safe operating temperature. While the foregoing function of the charger is collateral to the primary function thereof, it is an important function since it prevents the burning out of the SCR's X and Y and eliminates the valuable downtime and costly repairs that are brought about by the burning out of SCR's in battery chargers of the general class here concerned with.

A second temperature sensor 37, such as a thermistor, is positioned in heat conducting relationship with the battery terminal engaging clamp 20 and is connected with the controller C by a line 38, a portion of which line extends parallel with the battery charging cable 16. The clamp 20 with which the sensor 37 is related, is a heat conducting metal structure into which heat from the battery terminal 28 is conducted. The sensor 37 is carried by the clamp 20 at a position where it is in close relationship with the terminal 18 and is such that it reads the temperature of the battery, at the terminal 18, and is effective to monitor the temperature of the battery for the purpose of detecting overheating thereof.

The present invention next includes a load resister 40 that is connected with and between the conductor lines 31 and 28 by a line 41. A normally open electro-mechanical relay switch 42 is connected in the line 41, between the resistor 40 and line 28, to control the flow of current through the resistor 40. The relay 40 is connected with the controller C by lines 43 and 43'.

The controller C is connected with the line 41 at a point between the resistor 40 and the relay 41 by a line 44.

The controller C is connected with the clamp 19 and the terminal post 17 of the battery B by line 45, a portion of which extends parallel with the cable 15. The controller is connected with the clamp 20 with the negative terminal post 18 of the battery B by a line 46, a portion of which extends parallel with the cable 16.

Connected with the controller C are five light emitting devices or signal lamps 50, 51, 52, 53 and 54; and, an audible alarm emitter 55. The lamps can be any suitable form of light emitting device. The emitter 55 can be a horn, bell or buzzer. The several lamps are mounted on and are visible at the control panel 13. The sound emitter or horn 55 can be mounted at the panel 13 or at any other suitable location in or about the case C. For the purpose of this disclosure the lamps 50–54 will be called: power on, reverse polarity, stop, operating (or charger on), and charge complete, respectively.

Figure 3:
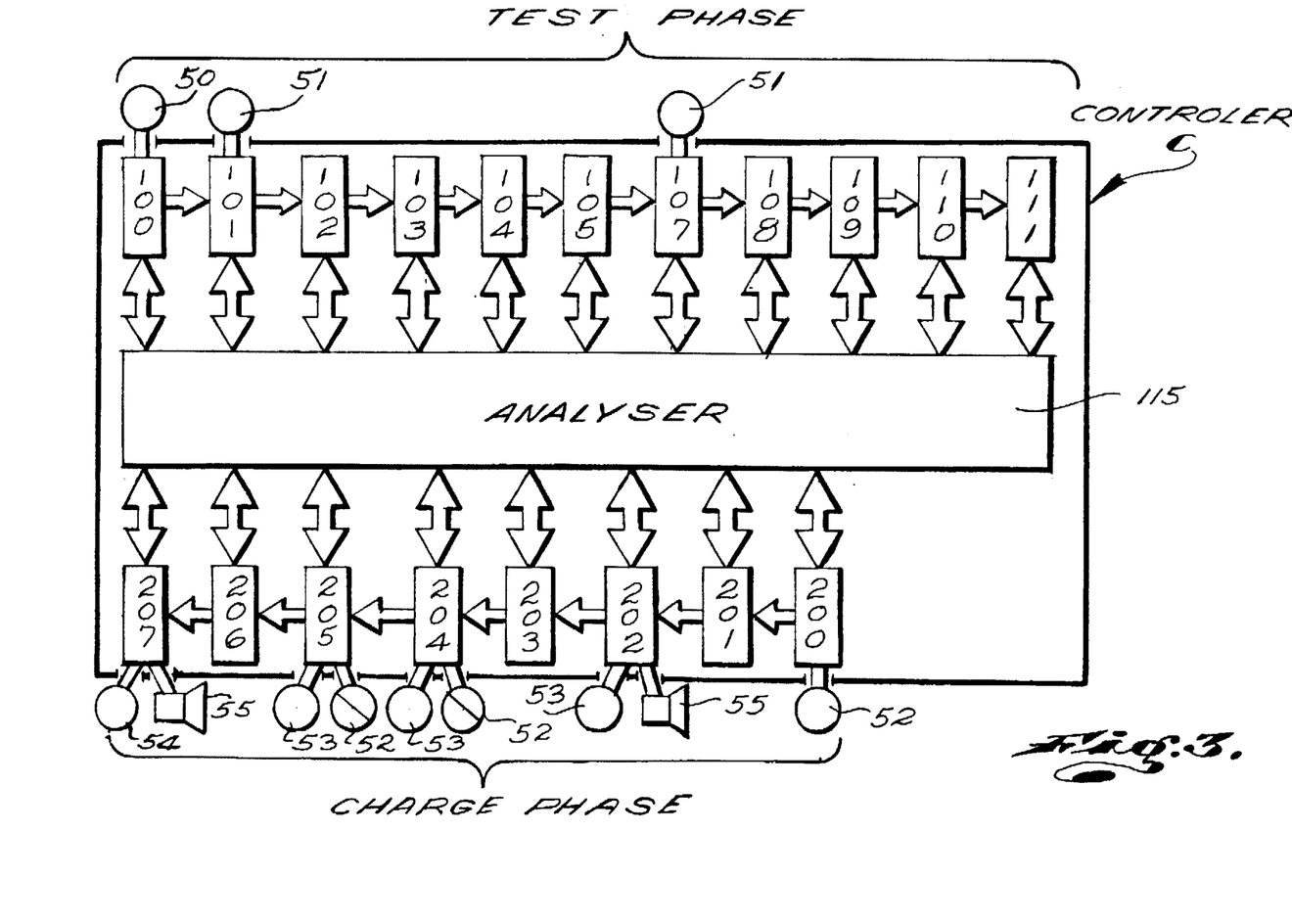
FIG. 3 is a block diagram illustrating the sequential functions performed by the charger during testing and charging of the battery.

In FIG. 3 of the drawings, I have diagrammatically illustrated the programmed process or method of operation of the charger A wherein the step-by-step functions performed, under control of the controller C, during the battery testing phase are identified by sequentially related function blocks 100 through 111 and where the several functions performed during the charging phase are identified by sequentially related function blocks 200 through 207.

When the switch 21 (at the control panel 13) is manually closed the controller C is energized and is programmed, at 100, to energize and cause the power-on lamp 50 and the operating lamp 53 to illuminate.

The controller C is next programmed at 101 to read the polarity of the circuit established when the cables 15 and 16 of the charger are connected with the terminal posts 17 and 18 of the battery. If the cables are crossed and the polarity of the circuit is reversed, the controller at 101 functions to stop the program and operation of the charger and to energize and cause the stop lamp 51 to illuminate. This "polarity-check" and illumination of lamp 51 warns the operator of the charger that the cable 15 and 16 are crossed and advises him to turn the charger off, at switch 21, to correctly connect the cables with the battery and to again close the switch 21 and cause the programmed battery testing phase of the charger to proceed.

The controller C is next programmed, at 102, to read and to store in memory the circuit voltage between the terminal 17 and 18 of the battery.

After the circuit voltage is read and stored (at 102) the controller is programmed, at 103, to read the temperature of the battery (by means of the sensor 37) and to store that first read temperature in memory.

Coincidentally with reading the first battery temperature and storing it in memory, or immediately following that function, the controller is programmed, at 104, to cause the relay switch 42 to close and to thereby cause a first test current to flow through the load resistor 40 and through the battery for a short predetermined period of time. That period of time might, for an example, be as little as 15 seconds.

When the relay switch 42 is closed and the first test current is applied to the battery, the controller is programmed at 105 to read and store in memory a first test load voltage.

Following reading and storing of the first test load voltage the controller is next programmed at 106 to read and record in its memory a first series of battery recovery voltages. The reading and recording of the first series of the recovery voltages is time to occur a short predetermined period of time after the first test charging current to the battery is discontinued. This series of recovery voltages can, for example, include 3 battery voltage readings taken at 5 second intervals.

For the purpose of this disclosure in FIG. 3, the controller C is shown as including an analyzer means or section 115 that includes the memory bank or data storage means in which data acquired from the battery and the charger is stored and in which the operating program of the controller and for the charger is installed.

The several functions blocks 100 through 111 and 200 through 207 shown in FIG. 3 of the drawings are shown connected with the analyzer section 115 and are representative of the programmed functions that are directed and carried out by the controller.

The program installed in the controller C includes predetermined referenced voltage data that corresponds to the voltages that are read and recorded in memory during the battery test phase and that define the voltages parameters within which the recorded battery voltages or data must lie if the battery B is rechargeable. These programmed referenced voltages can be calculated and/or determined by imperical battery testing procedures prior to and during creation of the program.

The controller C is next programmed, within the analyzer section 115, to compare the read and stored in memory first test load voltage and the first read and stored in memory load and recovery voltages with each other and with their corresponding reference voltage data in the program. If the compared voltages are outside the parameter set by the programmed reference voltages the controller is programmed, at 107, to stop the testing program and further functioning of the charger and to energize and cause the stop lamp 51 to illuminate.

Factors such as excessive plate sulfation, shorting of plates, and defective welds in a battery are the most common factors that result in load and/or recovery voltages that fall outside the predetermined voltage parameters that are necessary for a rechargeable battery.

If, at 107, the stop lamp 51 is energized, the operator of the charger is warned that the battery is not rechargeable and that power to the charger should be turned off and that the battery should be disconnected from the charger and suitably set aside or disposed of.

The controller C is next programmed, at 108, to apply operating voltages to the gates of the SCR's X and Y of the rectifier 30 and to thereby turn on the charger. When the charger is on, it directs a second test current to the battery B for a predetermined period of time. This first test current can, for example, be applied to the battery for 5 minutes.

After the second test current has been applied to the battery, the controller is programmed at 109 to again direct and cause the relay 42 to close and to thereby conduct current through the load resistor 40 and to read and store in memory a second test load voltage.

Following application of the second test current to the battery and reading and recording of the second test load voltage, the controller is next programmed, at 110, to read and record in memory a second series of battery recovery voltages. The timing and the number of recovery voltage readings taken at 110 is the same as the first series of recovery voltage readings taken at 106.

The controller is next programmed at 111 to read and record in memory a second battery temperature.

With the first and second temperature readings, the first and second load voltage readings, and the first and second series of recovery voltage readings in memory, the analyzer section 115 is next programmed to compare and correlate the above noted data with corresponding temperature and voltage reference data in the program. If any one or any combination of the acquired data stored in memory and compared with related reference data in the program is not within the parameters set by the programmed reference data, the controller is again programmed at 107 to terminate the program, stop the charger and cause the stop lamp 51 to illuminate. Should this occur, the operator is warned that the battery is not rechargeable or is not rechargeable within those parameters that the charger is programmed to operate within.

The foregoing test phase of my new charger is completed in no more than 6 minutes.

If the comparisons made by the analyzer section 115 show that the battery is rechargeable, the analyzer section 115 calculates the maximum amperage of charging current that can be safely directed to the battery. The section 115 also calculates the maximum time that the calculated maximum charging current must be applied to the battery to effect full recharging thereof.

If the charging current output of the charger is not infinitely variable, the calculated maximum charging current is correlated with the current that the charger can deliver that is closest to the calculated charging current and calculates the time that the deliverable charging current will have to be applied to the battery to effect full charging thereof.

The analyzer section 115 also calculates and sets the maximum charging voltage that can be let to develop in the battery during charging.

The controller C is next programmed to commence the charge phase and is programmed at 200 to cause operating voltages to be directed to the gates of the SCR's X and Y of the rectifier 30 and thereby put the charger in full charging mode where it causes its maximum charging current to be directed through the battery.

Immediately following turning on the charger at 200, the controller is, at 201, programmed to adjust the operating voltages to the gates of the SCR's of the rectifier 30 and to adjust the amperage of the charging current delivered to the battery to the amperage of the previously calculated maximum charging current.

When the charger is turned on at 100, the analyzer section 115 sets and starts a timer at 105. The timing period set at 105 is the calculated maximum period of time that the charger must operate to fully recharge the battery. Under most anticipated conditions, the battery with which the charger is related is fully charged before the time set at 105 expires.

During charging of the battery, the temperature of the battery is monitored at 201. If the temperature of the battery exceeds a set maximum operating temperature, the controller is programmed at 202 to stop charging of the battery, de-energize or turn off the operating lamp 52 and to energize and illuminate the charge-off lamp 53. In practice, when the temperature exceeds the set limit and the charge-off 53 is illuminated, the horn 55 is energized, since over-heating of the battery B creates hazardous conditions that are deserving of special attention.

During charging of the battery, the charging voltage is continuously monitored at 203. If the charging voltage increases beyond a limit that is calculated and set within the analyzer section 115, the controller is programmed at 203 to direct and cause rectifier 30 to reduce the amperage of the charging current. This function is continued or repeated until a charging current voltage of desired value is obtained.

While the battery is being charged at the prescribed or adjusted charging current, the charging voltage slowly increases at a substantially uniform rate. That change eventually stops or become "neutral". Changing of the charging current voltage stops or becomes neutral when the battery approaches a fully charged state.

The controller C is programmed at 204 to monitor the rate of change of the charging current voltage and directs and causes the charger to turn-off when the rate of change is less then a predetermined minimum rate of change, or when the change stops or becomes negative. When the controller operates to turn the charger off, at 204, the lamp 52 is turned-off and the lamp 53 is turned-on.

If the calculated set maximum charging time period expires before the battery is fully charged and the charger is turned-off at 204, the controller is programmed at 205 to stop the battery charger and to turn the charge lamp 52 off and the lamp 53 on.

After the charge phase has been stopped or terminated at 204 or 205, the controller is programmed, at 206, to close the relay 42 and thereby cause the battery to discharge for a sufficient period of time to depolarize the battery plates. (Polarization of the plates develops during charging of the battery and if not removed would interfere with the effective and efficient operation of the battery.)

Finally, the controller is programmed at 207 to energize and cause the complete charge lamp 54 to illuminate and the horn 55 to sound. When the foregoing occurs the operator of the charger is made aware that the battery is charged and can, after turning off switch 21, be disconnected from the charger and put to its intended use.

An important and novel aspect and feature of this invention resides in the provision of a battery charger that, upon being connected with a battery and turned on, immediately tests the battery for shorted plates, open wells and other defects that render the battery non-rechargeable and signals the operator of the charger that the battery is non-rechargeable. A next important and novel feature of the invention resides in the provision of a battery charger that, when connected with a battery that is not determined to be non-rechargeable as result of shorted plates, open wells and the like, operates to quickly test the battery for latent defects or conditions that render it unable or unsuitable to receive a charge and to signal the operator of the charger that the battery is unsuitable to be recharged. The foregoing is completed in less than 6 minutes following connection of the battery with the charger and turning on the charger.

A next important and novel feature of the invention resides in the provision of a battery charger which, upon testing of a battery connected therewith and finding that the battery is rechargeable, functions to calculate the maximum charging current the battery can safety accept; the maximum period of time that charging current must be applied to the battery to effect full recharging thereof; that automatically operates to cause that calculated charging current to be directed to the battery; and, that operates to turn the charger off and to signal the operator that the battery is recharged, or when the set maximum charging period has expired, whichever occurs first.

Having described only one typically preferred form and/ or embodiment of my invention I do not wish to be limited to the specific details herein setforth but wish to reserve myself any modifications and/or variations that might appeal to those skilled in the art and that fall within the scope of the following claims.

Having described my invention I claim:

1. A storage battery charger including a high voltage AC power supply, a normally open power control switch in the power supply, a step-down transformer with an elongated primary winding connected with the power supply and including first and second secondary windings; a full wave rectifier including a pair of SCRs the anodes of which are connected with opposite related ends of the first secondary winding; a first current line extending between and connected with the center of the primary secondary winding and the anode terminal of a battery; a shunt in the first current line to effect reading current flowing through that line; a second current line extending between and connected with the rectifier and the cathode terminal of the battery; a conductor line extending between and connected with the first and second current lines; a load resistor connected in the conductor line; a normally open relay switch connected in the conductor line between the resistor and the first current line; a battery temperature sensor device at a terminal of the battery; a controller including an analog to digital converter, a programmed microprocessor with a related memory bank; power supply lines connecting the controller with the second secondary winding; a plurality voltage conducting lines extending connected for the controller and each of which is connected with a related anode or gate of the SCRs, the shunt, the relay switch, the conductor line between the resistor and the relay switch, the battery anode terminal, the battery cathode terminal and the temperature sensor device; a plurality of signal emitting devices connected with the controller; the programmed microprocessor operates to cause the charger to first direct a first test current to the battery; to next read and record in its memory bank, a first load voltage; to next read and record in its memory first bank recovery voltages; to next direct and cause the charger to direct a second test current to the battery; to next read and record in its memory a second load voltage; to next read and record in its memory second recovery voltages; read and record in its memory the battery temperature; and, read and record in its memory charging current voltages; temperature and voltage reference data that define the temperature and voltages parameters for rechargeable batteries is stored in the memory bank; the microprocessor operates to compare the read and recorded temperature and voltages with the reference data and operates to stop programmed operation of the charger and energize a signal emitting device when the read and recorded temperature and voltages are outside parameters defined by the reference data when programmed operation of the charger is not stopped the microprocessor next causes the rectifier to function to conduct a recharging current through the battery.

2. The battery charger set forth in claim 1 wherein the programmed microprocessor operates to stop the functioning of the charger and to energize a signal emitting device when the first and second current lines are improperly-connected with the terminals of the battery.

3. The battery charger set set forth in claim 1 wherein the programmed microprocessor operates to stop the functioning of the charger and to energize a signal emitting device when no voltage from the battery is read.

4. The battery charger set forth in claim 1 wherein the programmed microprocessor operates to stop the functioning of the charger and to energize a signal emitting devices when the first and second current lines are improperly-connected with the terminals of the battery when no battery voltage is read.

5. The battery charger set forth in claim 1 wherein the programmed microprocessor operates to calculate the maximum amperage of a charging current that the battery can effectively accept and causes the rectifier to operate to direct a charging current at the calculated amperage to the battery.

6. The battery charger set forth in claim 1 wherein the programmed microprocessor operates to stop the functioning of the charger and to energize signal emitting devices when the first and second current lines are improperly-connected with the terminals of the battery; calculates the maximum amperage of a charging current that the battery can effectively accept; and causes the rectifier to operate to direct a charging current at the calculated amperage to the battery.

7. The battery charger set forth in claim 1 wherein the programmed microprocessor operates to stop functioning of the charger and to energize signal emitting devices when no voltage from the battery is read; operates to calculate the maximum amperage of a charging current the battery can effectively accept; and operates and causes the rectifier to operate and direct a charging current at the the calculated amperage to the battery.

8. The battery charger set forth in claim 1 wherein the programmed microprocessor operates to stop the functioning of the charger and to energize a signal emitting devices when the first and second current lines are improperly-connected with the terminals of the battery when no battery voltage is read; calculates the maximum amperage of a charging current that the battery can effectively accept and causes the rectifier to operate to direct a charging current of the calculated amperage to the battery.

9. The battery charger set forth in claim 1 wherein the programmed microprocessor operates to monitor changes of voltage of the charging current to the battery and operates to stop the functioning of the charger and to energize signal emitting devices when the change of voltage of the charging current reaches a value included in the stored reference data.

10. The battery charger set forth in claim 1 wherein the programmed microprocessor operates to stop functioning of the charger and to energize signal emitting devices when the first and second current lines are improperly-connected with the terminals of the battery; monitors changes of voltage of the charging current to the battery and operates to stop functioning of the charger and to energize signal emitting devices when the change of voltage of the charging current reaches a value included in the stored reference data.

11. The battery charger set forth in claim 1 wherein the programmed microprocessor operates to stop functioning of the charger and to energize a signal emitting device when no voltage from the battery is read; monitors changes of voltage in the charging current to the battery; functions to stop the functioning of the charger and to energize signal emitting devices when the change of voltage of the charging current reaches a value included in the stored reference data.

12. The battery charger set forth in claim 1 wherein the programmed microprocessor operates to stop functioning of the charger and to energize a single emitting device when the first and second current lines are improperly-connected with the terminals of the battery, operates to stop operation of the charger and to energize a signal emitting device when no battery voltage is read, operates to monitor changes of voltage of the charging current to the battery and to stop operation of the charger and to energize a signal emitting devices when the change of voltage of the charging current reaches a value that is included in the stored reference data.

13. The battery charger set forth in claim 1 wherein the programmed microprocessor operates to monitor changes of voltage in the charging current to the battery and operates to stop functioning of the charger and to energize signal emitting devices when the change of voltage of the charging current reaches a value included in the stored reference data.

14. The battery charger set forth in claim 1 wherein the programmed microprocessor operates to stop functioning of the charger and to energize a signal emitting device when the first and second current lines are improperly-connected wit the terminals of the battery, calculates the maximum amperage of a charging current that the battery can effectively accept and and causes the rectifier to function to direct a charging current at the calculated amperage to the battery; and wherein the programmed microprocessor operates to monitor changes of voltage in the charging current to the battery and stops operation of the charger and energizes a signal emitting devices when the change of voltage of the charging current reaches a value included in the recorded reference data.

15. The battery charger set forth in claim 1 wherein the programmed microprocessor operates to stop functioning of the charger and to energize a signal emitting device when no voltage from the batter is read calculates the maximum amperage of a charging current that the battery can effectively accept and causes the rectifier to operate to direct the charging current to the battery at the calculated amperage and, wherein the programmed microprocessor operates to monitor changes of the charging current to the battery and to stop operations of the charger and to energize signal emitting devices when the change of voltage of the charging current voltage reaches a value included in the stored reference data.

16. The battery charger set forth in claim 1 wherein the programmed microprocessor operates to stop functioning of the charger and to energize a single emitting device when the first and second current lines are improperly-connected wit the terminals of the battery stops operation of the charger and energizes signal emitting devices when the change of voltage of the charging current reaches a value included in the stored reference data causes the battery to discharge after the charging current is stopped to eliminate undesired polarization therein.

17. The battery charger set forth in claim 1 wherein the controller is programmed and functions to monitor the change of voltage of the charging current to the battery and functions to stop programmed functioning of the charger and to energize signal emitting devices when the change of voltage of the charging current reaches a value set in the reference voltage data; and, wherein the controller directs and causes the battery to discharge after the charging current is stopped to eliminate undesired polarization therein.

18. The battery charger set forth in claim 1 wherein the controller is programmed and functions to stop programmed functioning of the charger and to energize a signal emitting device when the first and second current lines are improperly connected with the terminals of the battery; wherein the controller is programmed and functions to stop the programmed functioning of the charger and to energize a signal emitting device when no battery voltage is read; the controller program functions to calculate the maximum amperage of a charging current that the battery can effectively accept and directs and causes the rectifier to function to direct the calculated charging current to the battery; wherein the controller is programmed and functions to monitor the change of voltage of the charging current to the battery and functions to stop programmed functioning of the charger and to energize signal emitting devices when the change voltage of the current of charging reaches a value set in the reference voltage data; and, wherein the controller is programmed to direct and cause the battery to discharge after the charging current is stopped to eliminate undesired polarization therein.

* * * * *

UNITED STATES PATENT AND TRADEMARK OFFICE
CERTIFICATE OF CORRECTION

PATENT NO.  : 5,767,661
DATED       : June 16, 1998
INVENTOR(S) : Carlos Williams It is certified that error appears in the above-identified patent and that said Letters Patent is hereby corrected as shown below:

On the title page, item [57] Abstract, should read

A lead-acid storage battery charger including a DC power supply, first and second current lines connected between the power supply and anode and cathode terminals of a battery, a shunt connected in the first current line, a rectifier connected in the second current line, a conductor line connected between the first and second current lines, a resister and a relay switch connected in the conductor line, a programmed microprocessor with a memory bank in which reference data defining the voltage parameters for chargeable batteries is stored is connected with the power supply, rectifier, shunt, switch and terminals and operates to cause the charger to conduct first and second test currents through the battery and to read and record into memory first and second load and recovery voltages, the microprocessor next operates to compare the recorded voltages with the reference data and operates to cause the charger to conduct a charging current through the battery or to stop functioning of the charger if the recorded voltages are without the parameters defined by the data.

Signed and Sealed this

Eighth Day of September, 1998

*Attest:*

BRUCE LEHMAN

*Attesting Officer*     *Commissioner of Patents and Trademarks*